US010946406B2

(12) United States Patent
Reuter et al.

(10) Patent No.: US 10,946,406 B2
(45) Date of Patent: Mar. 16, 2021

(54) METERING APPARATUS

(71) Applicant: Marco Systemanalyse und Entwicklung GmbH, Dachau (DE)

(72) Inventors: Martin Reuter, Dachau (DE); Paul Reuter, Dachau (DE)

(73) Assignee: Marco Systemanalyse und Entwicklung GmbH

( * ) Notice: Subject to any disclaimer, the term of this patent is extended or adjusted under 35 U.S.C. 154(b) by 0 days.

(21) Appl. No.: 16/056,845

(22) Filed: Aug. 7, 2018

(65) Prior Publication Data
US 2019/0054491 A1 Feb. 21, 2019

(30) Foreign Application Priority Data

Aug. 17, 2017 (DE) .......................... 102017118836.3

(51) Int. Cl.
| B05B 17/06 | (2006.01) |
| H01L 23/00 | (2006.01) |
| B05C 5/02 | (2006.01) |
| H02N 2/02 | (2006.01) |
| G01F 13/00 | (2006.01) |
| B23K 3/06 | (2006.01) |
| B05C 11/10 | (2006.01) |

(52) U.S. Cl.
CPC ........ *B05B 17/0607* (2013.01); *B05C 5/0225* (2013.01); *B23K 3/06* (2013.01); *G01F 13/00* (2013.01); *H01L 24/27* (2013.01); *H01L 24/75* (2013.01); *H02N 2/028* (2013.01); *B05C 5/0216* (2013.01); *B05C 11/1034* (2013.01); *H01L 2224/27318* (2013.01); *H01L 2224/75611* (2013.01)

(58) Field of Classification Search
None
See application file for complete search history.

(56) References Cited

U.S. PATENT DOCUMENTS

| 5,740,782 A * | 4/1998 | Lowi, Jr. ................ F02M 53/04 |
| | | 123/446 |
| 6,699,434 B1 * | 3/2004 | Lukasik .................... A61L 2/14 |
| | | 137/625.46 |
| 10,022,744 B2 | 7/2018 | MacIndoe et al. |
| 2004/0170771 A1 | 9/2004 | Bailey et al. |
| 2005/0104912 A1 | 5/2005 | Miura |
| 2011/0163120 A1 | 7/2011 | Read |

(Continued)

FOREIGN PATENT DOCUMENTS

| DE | 112009000667 T5 | 3/2011 |
| DE | 102015003159 T5 | 4/2017 |

(Continued)

OTHER PUBLICATIONS

Official Communication from the Patent Office in Taiwan; dated Jun. 26, 2019; 10 pages.

(Continued)

*Primary Examiner* — Jethro M. Pence
(74) *Attorney, Agent, or Firm* — Dickinson Wright PLLC (57) ABSTRACT

The invention relates to an apparatus for metering a medium comprising a base element provided for fastening to a robot, a metering valve movably supported at the base element, and at least one piezo actuator by which the metering valve is movable relative to the base element.

10 Claims, 6 Drawing Sheets

(56) References Cited

U.S. PATENT DOCUMENTS

2013/0251887 A1    9/2013   Myoung et al.
2017/0021559 A1    1/2017   Chang et al.

FOREIGN PATENT DOCUMENTS

| JP | 2004523906 A | 8/2004 |
| JP | 2005131498 A | 5/2005 |
| JP | 2008023471 A | 2/2008 |
| JP | 2011174907 A | 9/2011 |
| JP | 2013197580 A | 9/2013 |
| KR | 1020160137417 | 11/2016 |

OTHER PUBLICATIONS

Communication received from the Patent Office in Korea for related Korean Patent Application No. 20180095929; dated Dec. 9, 2019; 10 pages.

\* cited by examiner

METERING APPARATUS

The present invention relates to an apparatus fastenable to a robot for metering a medium.

Such a metering apparatus is generally known and is used, for example, in the semiconductor industry to apply defined quantities of a solder paste, in particular in the form of drops, onto a substrate to form solder points on the substrate. The attachment of the metering apparatus to a robot here enables a fully automatic implementation of a plurality of drop-like solder points within a predefined time period in that the robot travels the metering apparatus from one solder point to the next and stops for an exact placement of a drop. The masses of inertia that in particular occur on an accelerating and decelerating of the robot and that may lead to unwanted vibrations of the robot under certain circumstances and that can thereby impair an exact metering of the medium, and that at least limit the speed at which solder points can be placed have proven to be problematic in the known metering apparatus.

It is the underlying object of the invention to provide a metering apparatus that permits placing drops of a medium to be metered onto a substrate faster, with the drops nevertheless being exact.

The object is satisfied by an apparatus having the features of claim 1. The metering apparatus in accordance with the invention in particular comprises a base element provided for fastening to a robot, a metering valve movably supported at the base element, and at least one piezo actuator by which the metering valve is movable relative to the base element.

It is the underlying general idea of the invention not to implement the movement of the metering valve required for the placement of a drop solely by the robot, but rather to additionally provide a piezo actuator for this purpose. The robot movement so-to-say therefore has a piezo movement superposed on it that can be controlled substantially faster and more exactly in comparison with the robot movement. The metering apparatus can in this manner, for example, be traveled at a constant speed over the substrate, but at least without having to be significantly decelerated and accelerated, while the actual placement of the drop is triggered by the piezo actuator. As a result, exactly metered drops, in particular drops having a diameter in the range from 100 µm to 200 µm such as drops of a solder paste, can hereby be applied to a substrate a very great deal faster and thus more economically.

Advantageous embodiments of the invention can be seen from the dependent claims, from the description and from the drawing.

In accordance with an embodiment, a first piezo actuator is provided by which the metering valve is movable in a first direction relative to the base element and a second piezo actuator is provided by which the metering valve is movable in a second direction relative to the base element. In other words, two different piezo movements are provided that span a plane within which the metering valve can be moved. The strokes of the piezo actuators can be in the range from 100 µm to 500 µm.

The first and second directions are here preferably at least approximately at right angles to one another. One of the first and second directions can even coincide with the direction of movement of the robot, i.e. one of the piezo movements coincides with the robot movement. The first direction can, for example, be vertically oriented and can in particular define a Z direction, while the second direction is horizontally oriented and in particular defines an X or Y direction in which the robot can also move.

If a horizontal robot movement has a first piezo movement in the same direction and a second piezo movement in the vertical direction superposed on it, it is possible to describe a cycloid with the metering valve and in particular with a metering needle of the metering valve, said cycloid being particularly well suited for placing drops onto a substrate.

In accordance with a further embodiment, the metering valve is held by an intermediate element that is connected to the base element by means of at least one first flexible element, in particular by means of at least one first leaf spring. Two first flexible elements that form a parallelogram spring arrangement are advantageously provided for a clearance-free linear guide with small deflections. The at least one first flexible element enables a relative movement between the base element and the intermediate element that can preferably be effected by a first piezo actuator that is advantageously connected between the base element and the intermediate element.

In accordance with a further embodiment, the metering valve is connected to the intermediate element by means of at least one second flexible element, in particular by means of at least one second leaf spring. The at least one second flexible element enables a relative movement between the metering valve and the intermediate element that can preferably be effected by a second piezo actuator that is advantageously connected between the metering valve and the intermediate element.

The metering valve is preferably a slider valve since it prevents in a particularly effective manner particles of the medium to be metered from being able to clog the metering valve and thus contributes to a permanently reliable function of the metering valve.

In accordance with a further embodiment, a slider of the metering valve can be actuated by means of a third piezo actuator. Due to the use of a piezo drive for the metering valve, its already mentioned advantages of a fast and exact control also come into effect in the operation of the metering valve itself, i.e. in the actual metering. A direction of action of the third piezo actuator can here coincide with a direction of action of a piezo actuator for moving the metering valve and can, for example, be vertically oriented.

At least one sensor is advantageously provided for detecting the deflection of the at least one piezo actuator. A check can accordingly be made by such as sensor whether a desired deflection of the piezo actuator has actually been achieved by application of a voltage to the piezo actuator and the voltage can optionally be suitably adapted. In other words, the sensor enables a regulation of the piezo actuator. A corresponding sensor is preferably associated with each piezo actuator. In general, however, only one of the piezo actuators or a selection of piezo actuators can also be monitored with a respective one sensor.

The or each piezo actuator can comprise a piezo element deforming, in particular warping, on application of an electrical voltage and a cantilever arm attached to the piezo element. The stroke of the piezo actuator can be increased by the cantilever arm.

In accordance with a further embodiment, a cartridge for the medium to be metered is held in the base element. The cartridge can be fluidically connected to the metering valve by a line for the medium to be metered, with the line being at least sectionally formed by a flexible tube, in particular to compensate a movement of the metering valve relative to the base element and thus to the cartridge.

A further subject of the invention is a metering system comprising a robot and an apparatus of the above-described kind fastened thereto. The above-explained advantages can be correspondingly achieved by means of the metering system.

The invention further relates to a method of metering a medium by means of a metering system that comprises a robot and a metering valve movably supported at the robot, wherein the metering valve is traveled in a first direction by the robot and is simultaneously moved relative to the robot in the first direction by means of at least one first piezo actuator and in a second direction substantially perpendicular to the first direction by means of at least one second piezo actuator so that a metering needle of the metering valve describes a cycloid in a plane spanned by the first and second directions. Exactly metered drops, of a solder paste, for example, in particular drops having a diameter in the range of 100 µm to 200 µm, can be applied to a substrate particularly fast and economically using this method.

The invention will be described in the following purely by way of example with reference to an advantageous embodiment and to the enclosed drawing. There are shown.

A metering apparatus 10 for placing drops of a medium to be metered, here a solder paste, onto a substrate 110 (FIG. 6) is shown in the Figures.

The metering apparatus 10 comprises a base element 12 that serves to fasten the metering apparatus 10 to a robot 100 (FIG. 6) by means of which the metering apparatus 10 can be moved over a substrate 110 in a horizontal direction. The base element 12 is configured in the form of a rectangular plate and has a bore 14 15 in which a cartridge 16 is received. The cartridge 16 has an at least approximately vertically aligned cylindrical design and contains the medium to be metered, i.e. the solder paste Elastic connection elements 18, here in the form of leaf springs that extend vertically downwardly from the base element 12 and that serve for connecting an intermediate element 20 to the base element 12 are attached to oppositely disposed sides of the base element 12. The connection elements 18 form a parallelogram spring arrangement that makes it possible that the intermediate element 20 can move to and fro in a predefined horizontal direction relative to the base element 12. In this context, the direction of movement of the intermediate element 20 relative to the base element 12 is defined as the X direction, whereas the vertical direction is also called the Z direction.

The movement of the intermediate element 20 relative to the base element 12 is controlled by a pair of first piezo actuators 22 of which only one arranged at the front side can be recognized in the Figures. A correspondingly formed first piezo actuator 22 is arranged at the rear side of the metering apparatus 10.

Each first piezo actuator 22 comprises a piezo element 24 that is fastened to a lower side of the base element 12 and that deforms, warps in the present embodiment, on the application of an electrical voltage. A cantilever arm 26 is attached to the side of the piezo element 24 remote from the base element 12 and serves to increase the effective deflection of the piezo element 24 and thus the stroke of the piezo actuator 22. The piezo element 24 and the cantilever arm 26 are aligned substantially in the Z direction so that a free end of the cantilever arm 26 faces vertically downwardly and an activation of the piezo element 24 effects a deflection of the free end of the cantilever arm 26 in the horizontal direction, more precisely in the X direction. The cantilever arm 26 is rigidly coupled to the intermediate element 20 by means of a first connecting rod 28 in the region of its free end so that the deflection of the cantilever arm 26 is directly transmitted to the intermediate element 20. The intermediate element 20 can therefore be moved in the X direction relative to the base element 12, for example over a range of several 100 µm, by activating the first piezo actuators 22.

A valve carrier 30 is attached to a lower section of the intermediate element 20, and indeed by means of a horizontally aligned second leaf spring 32 that forms a joint that enables a rotation of the valve carrier 30 relative to the intermediate element 20. The valve carrier 30 carries a metering valve 34 that can accordingly in turn be moved relative to the intermediate element 20.

A pair of second piezo actuators 36, of which only one arranged at the front can be recognized in the Figures, is provided to control the movement of the valve carrier 30 and thus of the metering valve 34 relative to the intermediate element 20. A correspondingly formed second piezo actuator 36 is arranged at the rear side of the metering apparatus 10. Each second piezo actuator 36 comprises a piezo element 38 that is fastened to the base element 20 and that deforms, warps in the present embodiment, on the application of an electrical voltage. A cantilever arm 40 is attached to the side of the piezo element 38 remote from the intermediate element 20 and serves to increase the effective deflection of the piezo element 38 and thus the stroke of the piezo actuator 36. The piezo element 38 and the cantilever arm 40 are aligned substantially horizontally so that a free end of the cantilever arm 40 faces in the X direction and an activation of the piezo element 38 effects a deflection of the free end of the cantilever arm 40 in the vertical direction, i.e. in the Z direction. The cantilever arm 40 is rigidly coupled to the valve carrier 30 by means of a second connecting rod 41 in the region of its free end so that the deflection of the cantilever arm 40 is directly transmitted to the valve carrier 30. The valve carrier 30 and thus the metering valve 34 can therefore be moved in the Z direction relative to the intermediate element 20, for example over a range of several 100 µm, by activating the second piezo actuators 36.

A metering needle 42 for dispensing the medium to be metered is formed at a lower side of the metering valve 34 and can be moved relative to the base element 12 by a corresponding activation of the first piezo actuators 22 and of the second piezo actuators 36 in the Z direction, that is vertically, or in the X direction, that is horizontally. As mentioned, the first and second piezo actuators 22, 36 are formed such that the metering needle 42 can carry out a respective stroke of several 100 µm, for example up to 500 µm, relative to the base element 10 both in the X direction and in the Z direction.

If the metering apparatus 10 is moved over the substrate 110 at an at least approximately constant speed in the X direction by the robot 100 and if the first and second piezo actuators 22, 36 are simultaneously suitable controlled, the robot movement can have the piezo movements superposed such that the metering needle 42 describes a cycloid over the substrate 110. Drops of the medium to be metered having a diameter of, for example, 100 μm to 200 μm, can hereby be placed onto the substrate 110 in an ideal manner. It is understood that the metering needle 42 has a correspondingly adapted diameter that can, for example, be in the range of 100 mm to 150 mm for the present application.

Figure 4:
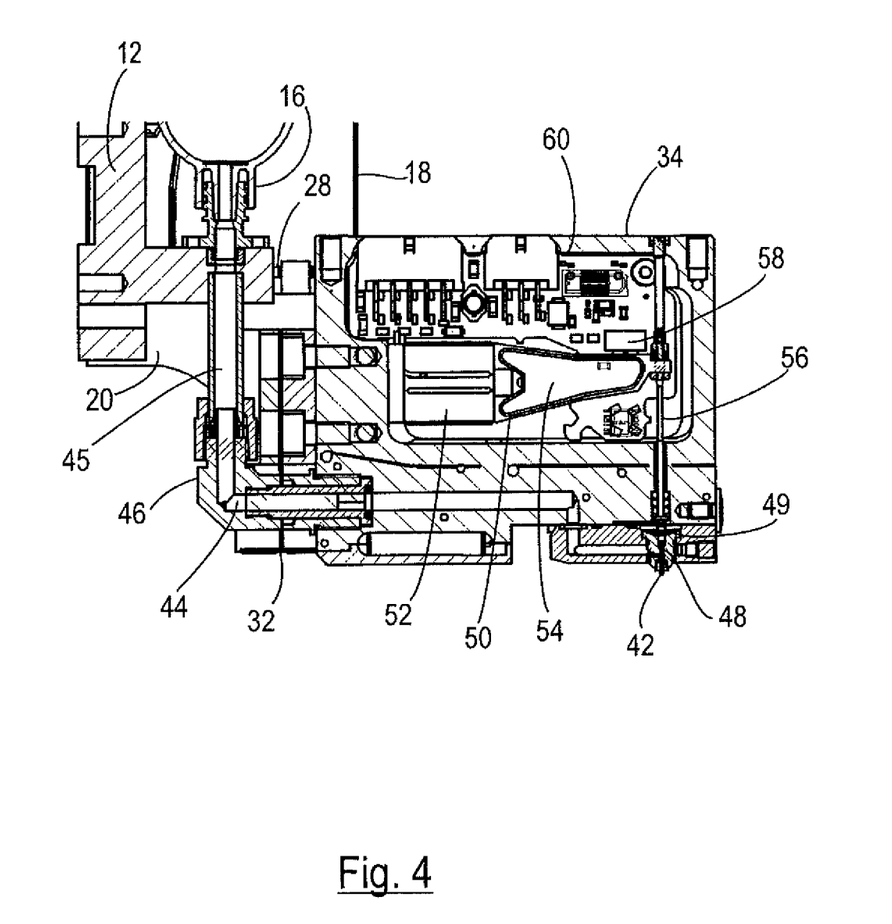
FIG. 4 a sectional view of the metering apparatus of FIG. 1.

The design of the metering valve 34 is shown more exactly in FIG. 4. The supply of the medium to be metered to the metering needle 42 takes place through a line 44 that connects the cartridge 16 to the metering needle 42. The line 44 is for the larger part implemented by bores in solid material. Since, however, the cartridge 16 is fixedly seated in the base element 12 while the metering valve 34 should move relative to the base element 12, a part section of the line 44 is formed by a flexible tube piece 45 that extends vertically through a cut-out of the intermediate element 20 and connects the cartridge 16 to a bracket 46 that is fixedly inserted into the metering valve 34.

Figure 5:
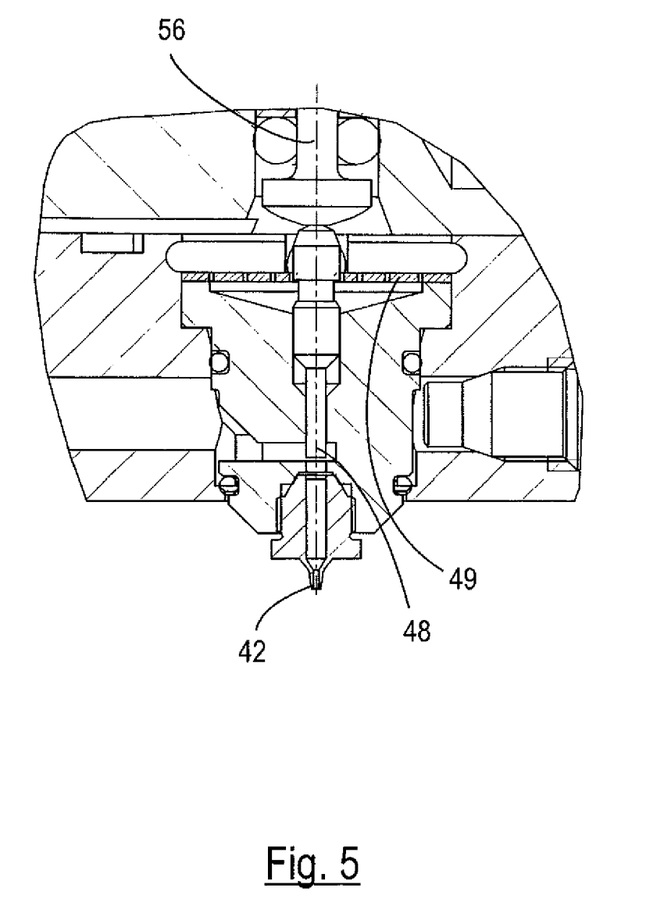
FIG. 5 a detailed view of a metering valve of the metering apparatus of FIG. 1.

The inlet of the medium to be metered supplied through the line 44 into the metering needle 42 is controlled by a slider 48 (FIGS. 4 and 5) that can be pushed downwardly in the Z direction against the return force of a plate spring 49 to block an inlet opening. The metering valve 34 is in other words a slider valve. The actuation of the slider 48 takes place by means of a third piezo actuator 50 that comprises a piezo element 52 that is fastened to a wall of the metering valve 34 facing the intermediate element 20 and that deforms, warps in the present embodiment, on application of an electrical voltage. A cantilever arm 54 is attached to the side of the piezo element 52 remote from the intermediate element 20 and serves to increase the effective deflection of the piezo element 52 and thus the stroke of the third piezo actuator 50. The piezo element 52 and the cantilever arm 54 are aligned substantially horizontally so that a free end of the cantilever arm 54 faces in the X direction and an activation of the piezo element 52 effects a deflection of the free end of the side arm 54 in the vertical direction, i.e. in the Z direction. The cantilever arm 54 is rigidly coupled to the slider 48 by means of a third connecting rod 56 in the region of its free end so that the deflection of the cantilever arm 54 is directly transmitted to the slider 48. The slider 48 can therefore be moved in the Z direction relative to the intermediate element 20 by activating the third piezo actuator 50 and can correspondingly control the dispensing of the medium to be metered through the metering needle 42.

Figure 1:
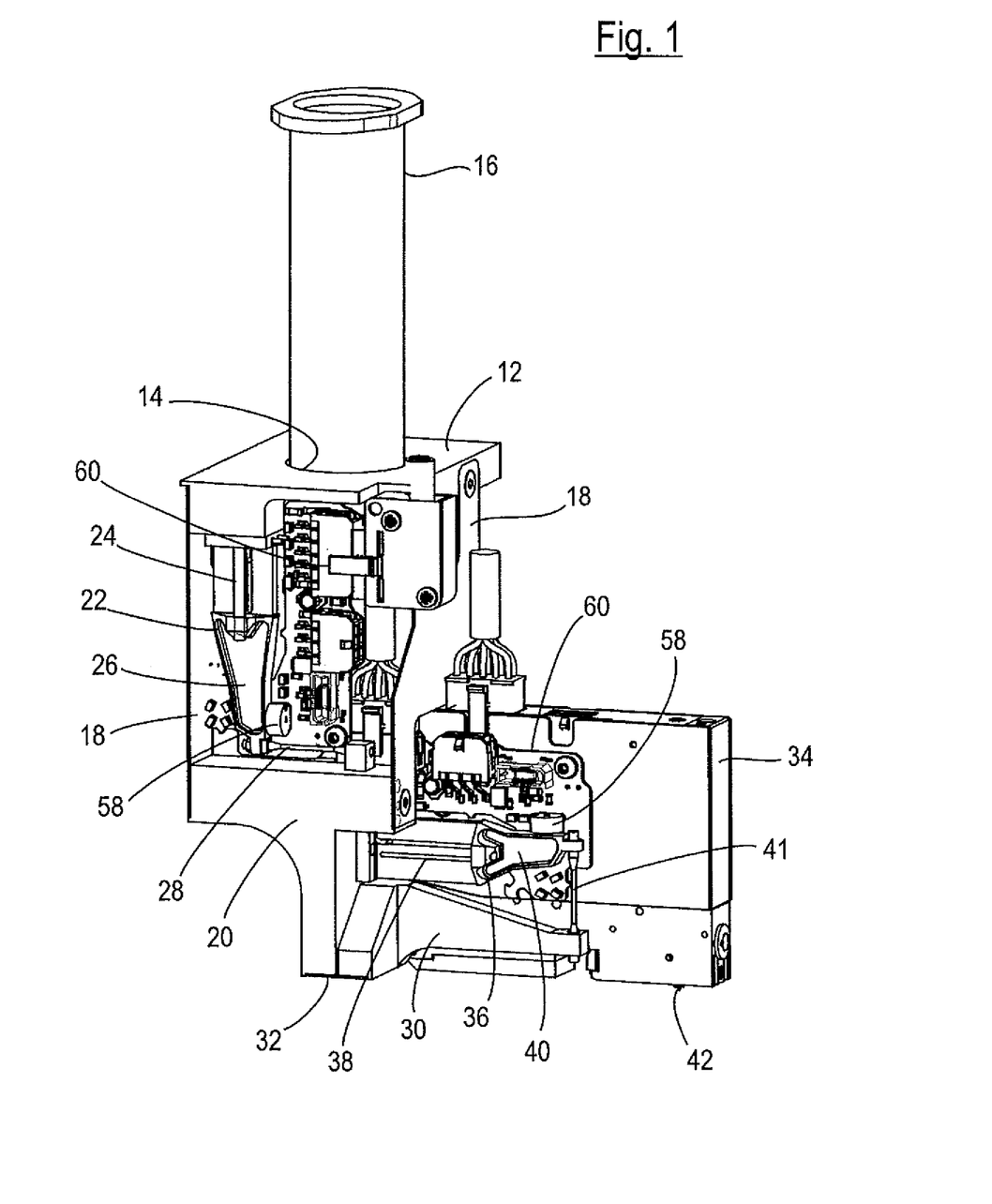
FIG. 1 a perspective view of a metering apparatus in accordance with the invention.
Figure 2:
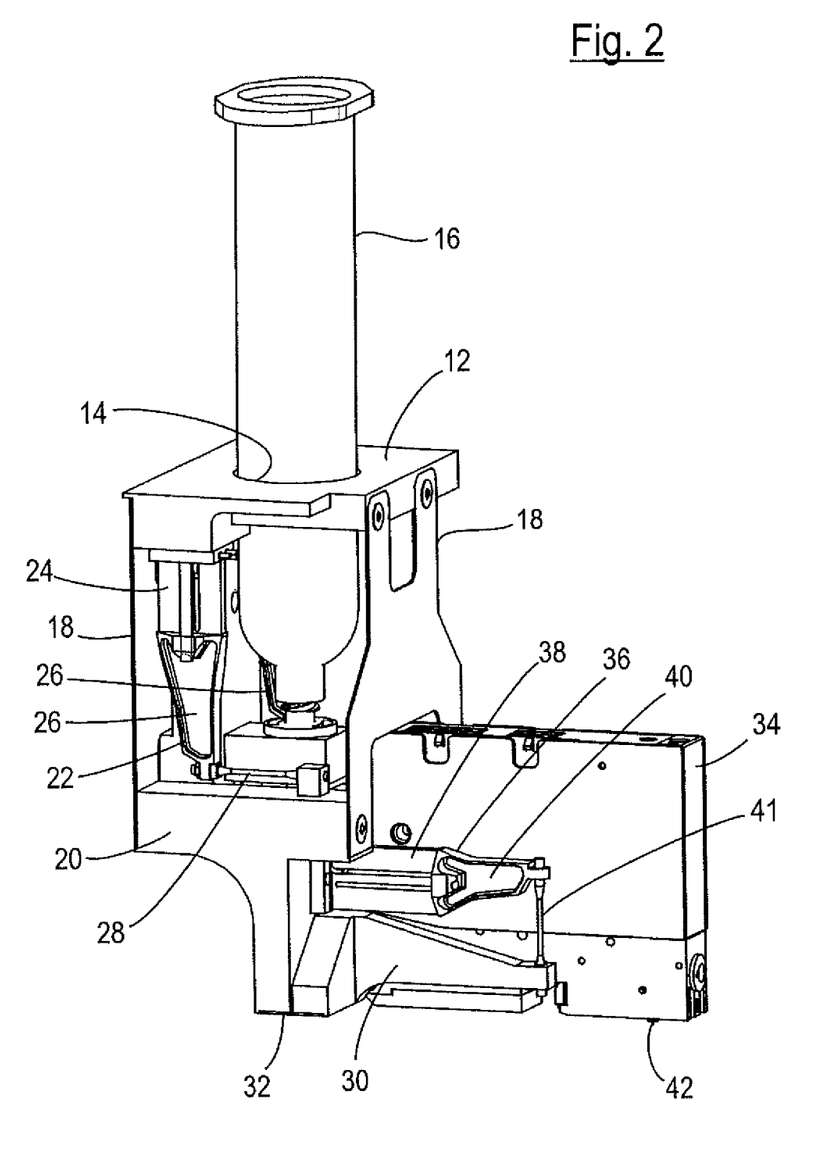
FIG. 2 a simplified perspective view of the metering apparatus of FIG. 1.
Figure 3:
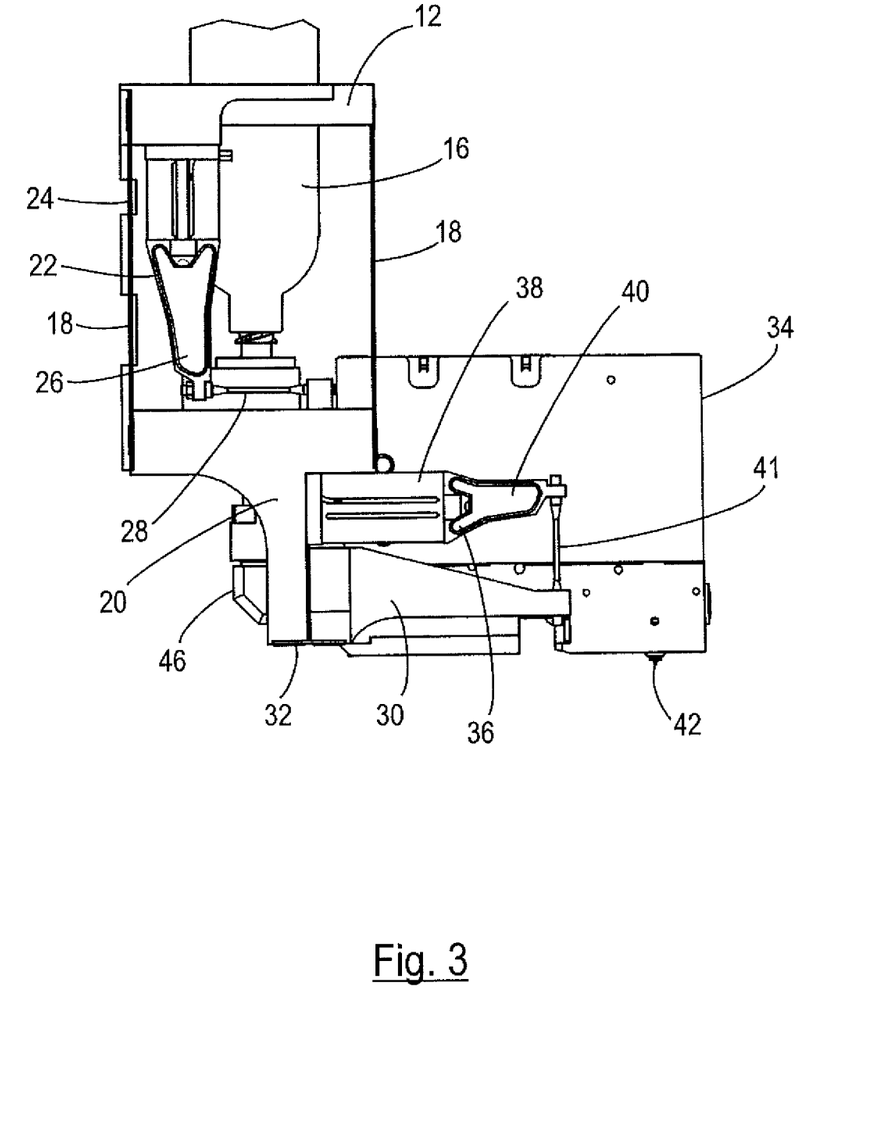
FIG. 3 a simplified side view of the metering apparatus of FIG. 1.

In the region of the free end of each cantilever arm 26, 40, 54, a sensor 58 is arranged for detecting the actual deflection of the respective cantilever arm 26, 40, 54 (FIG. 1). The detection of the actual deflection of each cantilever arm 26, 40, 54 enables a regulation of the piezo actuators 22, 36, 50 and contributes to a permanently exact operation of the metering apparatus 10.

It is understood that the metering apparatus 10 is equipped with suitable logic modules 58 for processing the signals output by the sensors 58 and for controlling or regulating the piezo actuators 22, 36, 50 (FIGS. 1 and 4).

Figure 6:
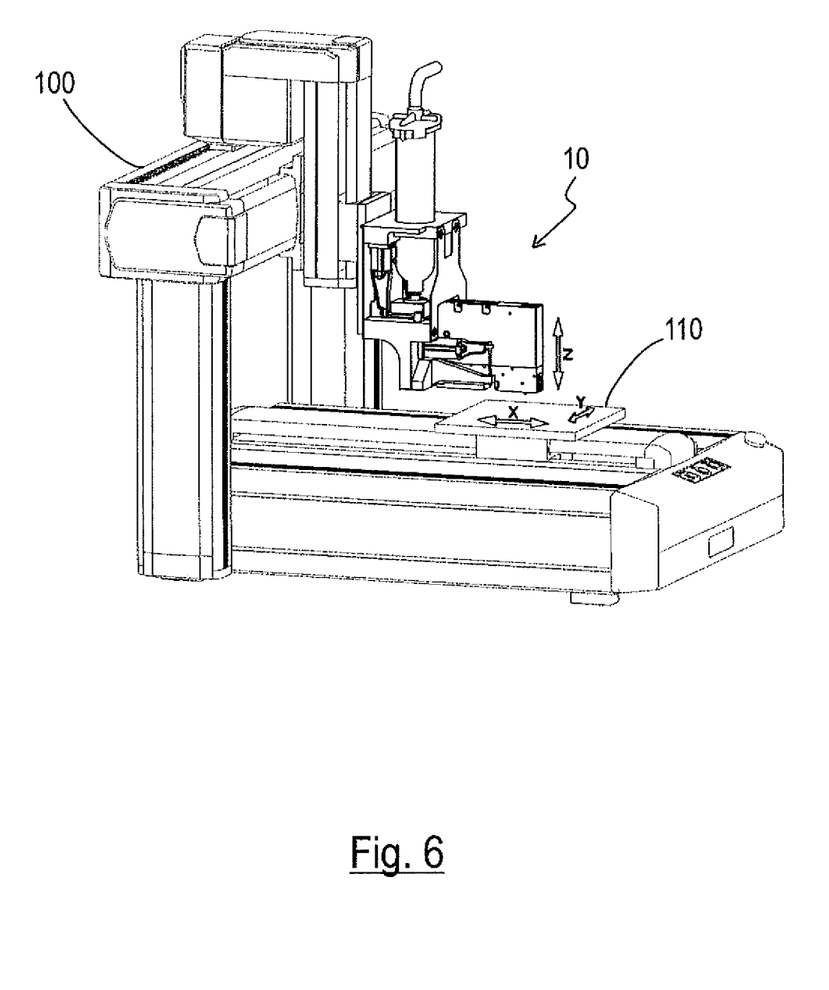
FIG. 6 a perspective view of a metering system in accordance with the invention with a metering apparatus of FIG. 1.

FIG. 6 shows a metering system comprising a robot 100 and a metering apparatus 10 fastened thereto for the placement of drops of solder paste onto the substrate 110.

REFERENCE NUMERAL LIST 10 metering apparatus
12 base element
14 bore
16 cartridge
18 connection element
20 intermediate element
22 piezo actuator
24 piezo element
26 cantilever arm
28 connecting rod
30 valve carrier
32 leaf spring
34 metering valve
36 piezo actuator
38 piezo element
40 cantilever arm
41 connecting rod
42 metering needle
44 line
45 tube piece
46 bracket
48 slider
49 plate spring
50 piezo actuator
52 piezo element
54 cantilever arm
56 connecting rod
58 sensor
60 logic module
100 robot
110 substrate

The invention claimed is:

1. A metering apparatus adapted to place drops of a medium to be metered onto a substrate, the metering apparatus comprising:
    a base element adapted to fasten the metering apparatus to a robot;
    a metering valve movably supported at the base element, wherein the metering valve is held at an intermediate element that is connected to, and movable relative to, the base element with at least one first flexible element;
    a first piezo actuator by which the metering valve is movable in a first direction relative to the base element, and
    a second piezo actuator by which the metering valve is movable in a second direction relative to the base element, wherein the first and second directions are at approximately right angles to one another.

2. The metering apparatus in accordance with claim 1, wherein the intermediate element is connected to the base element by means of at least one first leaf spring.

3. The metering apparatus in accordance with claim 1, wherein two first flexible elements are provided that form a parallelogram spring arrangement.

4. The metering apparatus in accordance with claim 1, wherein one of the first and second piezo actuator is connected between the base element and the intermediate element.

5. The metering apparatus in accordance with claim 1, wherein the metering valve is a slider valve.

6. The metering apparatus in accordance with claim 1, wherein a slider of the metering valve is actuable by means of a third piezo actuator.

7. The metering apparatus in accordance with claim 6, wherein a direction of action of the third piezo actuator coincides with a direction of action of a piezo actuator for moving the metering valve.

8. The metering apparatus in accordance with claim 1, wherein at least one sensor is provided for detecting a deflection of the at least one piezo actuator.

9. The metering apparatus in accordance with claim 1, wherein each of the first piezo actuator and the second piezo actuator comprises a piezo element deforming on application of an electrical voltage and a cantilever arm attached to the piezo element.

10. The metering apparatus in accordance with claim 9, wherein the piezo element of each of the first piezo actuator and the second piezo actuator warps on application of the electrical voltage.

* * * * *